United States Patent
Moon et al.

(10) Patent No.: US 6,362,995 B1
(45) Date of Patent: Mar. 26, 2002

(54) ARRANGEMENTS OF INTERFACE LOGIC, MEMORY CORE, DATA SHIFT AND PAD BLOCKS FOR INTEGRATED CIRCUIT MEMORY DEVICES

(75) Inventors: Byung-mo Moon, Seoul; Hong-sun Hwang, Kyungki-do, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/614,987

(22) Filed: Jul. 12, 2000

(30) Foreign Application Priority Data

Jul. 13, 1999 (KR) .............................. 99-28208

(51) Int. Cl.$^7$ ................................ G11C 5/02
(52) U.S. Cl. ................... 365/51; 365/63; 365/194; 365/230.03; 365/233; 365/221; 365/220
(58) Field of Search ................. 365/51, 63, 230.03, 365/194, 233, 219, 220, 221, 227

(56) References Cited

U.S. PATENT DOCUMENTS

| | | | | |
|---|---|---|---|---|
| 5,400,274 A | * | 3/1995 | Jones et al. | 365/63 |
| 5,473,575 A | | 12/1995 | Farmwald et al. | 365/230.06 |
| 5,578,940 A | | 11/1996 | Dillon et al. | 326/30 |
| 5,606,717 A | | 2/1997 | Farmwald et al. | 710/36 |
| 5,663,661 A | | 9/1997 | Dillon et al. | 326/30 |
| 5,708,621 A | * | 1/1998 | Tanoi | 365/230.06 |
| 5,771,200 A | * | 6/1998 | Cho et al. | 365/230.03 |
| 5,982,653 A | * | 11/1999 | Chu | 365/63 |
| 6,072,747 A | | 6/2000 | Yoon | 365/230.06 |
| 6,078,536 A | * | 6/2000 | Moon et al. | 365/201 |
| 6,151,264 A | | 11/2000 | Yoo | 365/230.03 |
| 6,160,731 A | * | 12/2000 | Choi | 365/63 |
| 6,256,218 B1 | | 7/2001 | Moon | 365/63 |

* cited by examiner

Primary Examiner—Andrew Q. Tran
(74) Attorney, Agent, or Firm—Myers Bigel Sibley & Sajovec

(57) ABSTRACT

Rambus Dynamic Random Access Memory (DRAM) devices may have their functional blocks arranged effectively in an integrated circuit substrate. A first memory core block an interface logic block, a pad block, an input/output and internal clock signal generation block, a data shift block and a second memory core block are sequentially arranged in one axial direction of the substrate. Accordingly, the lengths of data lines for transmitting data between a data input/output unit of the input/output and internal clock signal generation block and the data shift block may be reduced so that loads on the data lines may be reduced, thereby allowing data transmission speed to be maintained and/or power consumption to be reduced. Moreover, the data lines need not be wired between pads in the pad block, which can prevent the width of the substrate from increasing. The distance between the first memory core block and the pad block may be equal to the distance between the pad block and the second memory core block so that devices can be accurately packaged on a module board.

14 Claims, 3 Drawing Sheets

ARRANGEMENTS OF INTERFACE LOGIC, MEMORY CORE, DATA SHIFT AND PAD BLOCKS FOR INTEGRATED CIRCUIT MEMORY DEVICES

FIELD OF THE INVENTION the present invention relates to integrated circuit memory devices, and more particularly to arrangements of functional blocks in integrated circuit memory devices.

BACKGROUND OF THE INVENTION

Integrated circuit devices such as integrated circuit memory devices are widely used in consumer and commercial applications. Integrated circuit memory devices continue to increase in integration density and speed, while allowing reduced power consumption. For example, synchronous Dynamic Random Access Memories (DRAMs) that can operate in synchronization with system clocks have been developed to allow high speed operation. Dual Data Rate (DDR) synchronous DRAMs also have been developed to allow high performance memory devices.

Electronic systems such as data processing systems often use buses including a plurality of signal lines to interconnect integrated circuit devices, so that the integrated circuit devices can communicate with one another. Output drivers are generally included in microprocessor logic and/or memory intergrated circuits in order to drive signals that are internally generated in the integrated circuit onto the bus. These output drivers are generally driven by voltage level signals.

Recently, however, in order to achieve high speed operations and/or other advantages integrated circuit devices that include current mode output drivers have been provided. The use of current mode output drivers can reduce the peak switching current and signal reflections on the bus, to thereby allow low power, high performance communications between integrated circuits.

One technology that uses current mode output drivers is the Rambus technology that is marketed by Rambus Inc., Mountain View, Calif. The Rambus technology is described in U.S. Pat. No. 5,473,575 to Farmwald et al., U.S. Pat. No. 5,578,940 to Dillon et al., U.S. Pat. No. 5,606,717 to Farmwald et al. and U.S. Pat. No. 5,663,661 to Dillon et al. Also see U.S. Pat. No. 6,072,747 to Yoon that is assigned to the assignee of the present invention. Integrated circuit devices that include current mode output drivers also will be referred to herein as Rambus devices.

Rambus devices may operate at high data rates, for example at data rates of up to 800 MHz or more. Moreover, large amounts of data may be simultaneously read from memory cell arrays in Rambus DRAMS, so that large amounts of power may be consumed.

The area of the integrated circuit substrate, the operating speed and/or the power consumption may be considered when designing a Rambus device. Since the area of the substrate, the operating speed and the power consumption may depend on the arrangement of the functional blocks thereof, the functional blocks should be arranged such that the area can be reduced or minimized, the operating speed can be increased or maximized, and/or the power consumption can be reduced or minimized. An arrangement of functional blocks in a Rambus Dynamic Random Access Memory (DRAM) is disclosed in U.S. application Ser. No. 09/280,026 to Yoo, filed Mar. 26, 1999, now U.S. Pat. No. 6,151,264, entitled Integrated Circuit Memory Devices Including a single Data Shift Block Between First and Second Memory Banks, assigned to the assignee of the present application, the disclosure of which is hereby incorporated herein by reference in its entirety. Another arrangement of functional blocks for a Rambus device is disclosed in U.S. application Ser. No. 09/466,536 to Moon, filed Dec. 17, 1999, now U.S. Pat. No. 6,256,218, entitled "Integrated Circuit Memory Devices Having Adjacent Input/Output Buffers and Shift Blocks", assigned to the assignee of the present application, the disclosure of which is hereby incorporated herein by reference in its entirety.

FIG. 1 is a block diagram showing the arrangement of functional blocks in a Rambus DRAM disclosed in the above-cited application Ser. No. 09/280,026. Referring to FIG. 1, the disclosed Rambus DRAM includes first and second memory banks 111 and 121, first and second core interfaces 113 and 123, first and second data shift blocks 131 and 141, all interface logic block 151, first and second input/output units 161 and 162, a delay locked loop circuit 163 and a pad block 171 in an integrated circuit substrate 101 such as a semiconductor substrate. In a Rambus DRAM of FIG. 1, the first data shift block 131, the interface logic block 151, an input/output block including, the first input/output unit 161, the delay locked loop circuit 163 and the second input/output unit 162 the pad block 171 and the second data shift block 141 are sequentially arranged between the first memory bank 111 and the second memory bank 121.

This Rambus DRAM may have a disadvantage in that the area of a substrate 101 may increase because the first data shift block 131 for the first memory bank 111 and the second data shift block 141 for the second memory bank 121 are separate blocks. Moreover, since the first and second data shift blocks 131 and 141 are remote from the delay locked loop circuit 163 which generates internal clock signals including an input control clock signal SCLK and an output control clock signal TCLK, the lengths of clock lines for transmitting the input control clock signal SCLK and the output control clock signal TCLK to the first and second data shift blocks 131 and 141 may increase. This may increase the load on the outputs of the delay locked loop circuit 163 and may increase power consumption.

Furthermore, since the first data shift block 131 is remote from the pad block 171, the length of a wire or conductor for supplying a power supply voltage from the pad block 171 to the first data shift block 131 may increase. This may cause noise to occur in the power supply voltage and/or a ground voltage which are supplied from the pad block 171 to the first data shift block 131, so that the operation of the Rambus DRAM may become unstable.

FIG. 2 is a block diagram showing an arrangement of functional blocks in another Rambus DRAM disclosed in the above-cited application Ser. No. 09/280,026.

Referring to FIG. 2, a Rambus DRAM comprises first and second memory banks 211 and 221, first and second core interfaces 213 and 223, an interface logic block 231, first and second input/output units 241 and 242, a delay locked loop circuit 243, a pad block 251 and a data shift block 261 in an integrated circuit substrate 201 such as a semiconductor substrate. In the Rambus DRAM, the interface logic block 231, an input/output block including the first input/output unit 241, the delay locked loop circuit 243, and the second input/output unit 242, the pad block 251 and the data shift block 261 are sequentially arranged between the first memory bank 211 and the second memory bank 221. Moreover, in this Rambus DRAM, a data shift block for the first memory bank 211 and a data shift block for the second memory bank 221 are integrated into the single data shift block 261. Consequently, the area of the substrate 201 of FIG. 2 may decrease compared with that in the Rambus DRAM of FIG. 1.

Furthermore, since there is one data shift block, the lengths of clock lines connected to an output of the delay locked loop circuit 243, for transmitting the input control clock signal SCLK and the output control clock signal TCLK, may be shorter than in the Rambus DRAM shown in FIG. 1. Accordingly, the load on the output of the delay locked loop circuit 243 may decrease so that power consumption may be reduced as compared with the Rambus DRAM shown in FIG. 1. In addition, since the data shift block 261 is adjacent to the pad block 251, a wire or conductor for transmitting the power supply voltage and the ground voltage from the pad block 251 to the data shift block 261 may be shorter. Consequently, noise occurring in the power supply voltage and the ground voltage may be reduced.

However, since the Rambus DRAM shown in FIG. 2 may be designed such that data lines L2 and L4 for transmitting data between the respective first and second input/output units 241 and 242 and the data shift block 261 are wired between pads in the pad block 251, the data lines L2 and L4 may be relatively long. Accordingly, loads on the data lines L2 and L4 may be relatively large, which may result in reduced data transmission speed and/or an increase in power consumption. When many pads and data lines are provided, the substrate area also may increase in a horizontal direction of the Rambus DRAM shown in FIG. 2 since the data lines are wired between the pads in the pad block 251. In addition, it may be difficult to accurately locate the pads in the pad block 251 in the middle of the integrated circuit in the Rambus DRAM shown in FIG. 2. Consequently, when Rambus DRAMS are incorporated into a module, the Rambus DRAMs may not be accurately packaged on a module board.

SUMMARY OF THE INVENTION

Integrated circuit memory devices such as Rambus DRAMs, according to embodiments of the present invention, include first and second memory core blocks in an integrated circuit substrate, each including a memory cell array and control circuits that control the memory cell array, a pad block in the integrated circuit substrate including a plurality of pads, and an input/output and internal clock signal generation block in the integrated circuit substrate comprising a data input/output unit that sends and receives data to and from external of the memory device via the pad block, a command input unit that receives a command input from external of the memory device via the pad block and a delay locked loop circuit that receives an external clock signal input from external of the memory device via the pad block and generates internal clock signals. A data shift block also is included in the integrated circuit substrate that sends and receives data to and from the data input/output unit and sends and receives data to and from the first and second memory core blocks in synchronization with the internal clock signals. An interface logic block also is included in the integrated circuit substrate that receives and analyzes the command output from the command input unit to control the first and second memory core blocks, the input/output and internal clock signal generation block and the data shift block. The interface logic block is located in the integrated circuit substrate between the first memory core block and the pad block, and the input/output and internal clock signal generation block and the data shift block are located in the integrated circuit substrate between the pad block and the second memory core block.

In other embodiments of the invention, the input/output and internal clock signal generation block is located in the integrated circuit substrate adjacent to the pad block and the data shift block is located in the integrated circuit substrate adjacent to the second memory core block. In other embodiments, a distance between the first memory core block and the pad block is equal to a distance between the pad block and the second memory core block. In other embodiments, the delay locked loop circuit is located in the integrated circuit substrate between the data input/output unit and the command input unit.

Accordingly, in integrated circuits Such as Rambus DRAMs according to embodiments of the present invention, the pad block need not be arranged between the input/output and internal clock signal generation block and the data shift block. Therefore, the lengths of wires such as data lines for transmitting data between the data input/output unit and the data shift block call be reduced. As a result, the loads on the data lines can be reduced, thereby allowing data transmission speed to be maintained and/or power consumption to be reduced. Moreover, the data lines need not be wired between the pads so that the width of the substrate need not be increased. In addition, the distance between the first memory core block and the pad block can be equal to the distance between the pad block and the second memory core block, so that integrated circuit memory devices according to embodiments of the present invention can be accurately packaged on a module board.

DETAILED DESCRIPTION OF PREFERRED EMBODIMENTS

Figure 1:
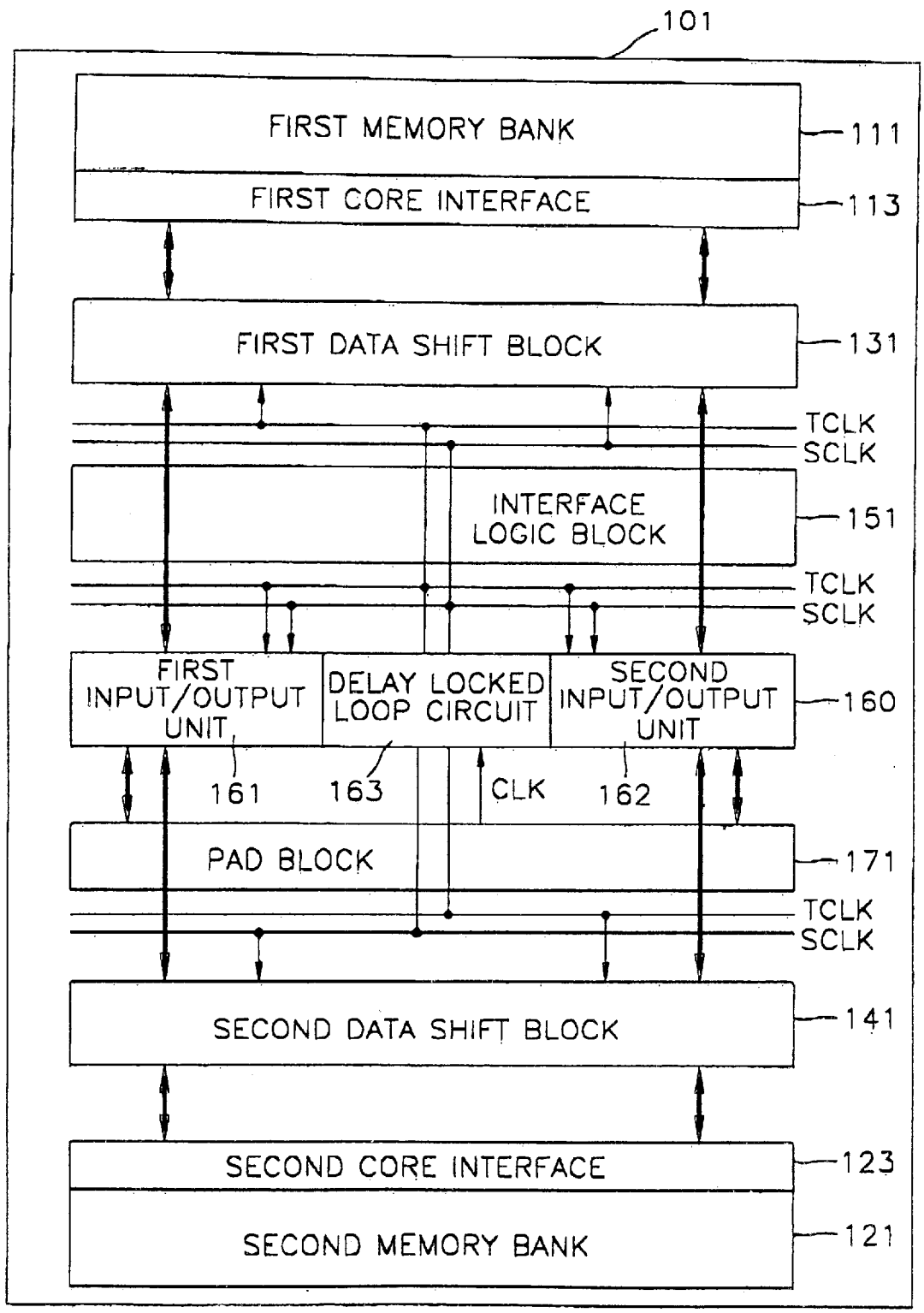
FIG. 1 is a block diagram slowing an arrangement of functional blocks in a Rambus Dynamic Random Access Memory (DRAM)

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 3:
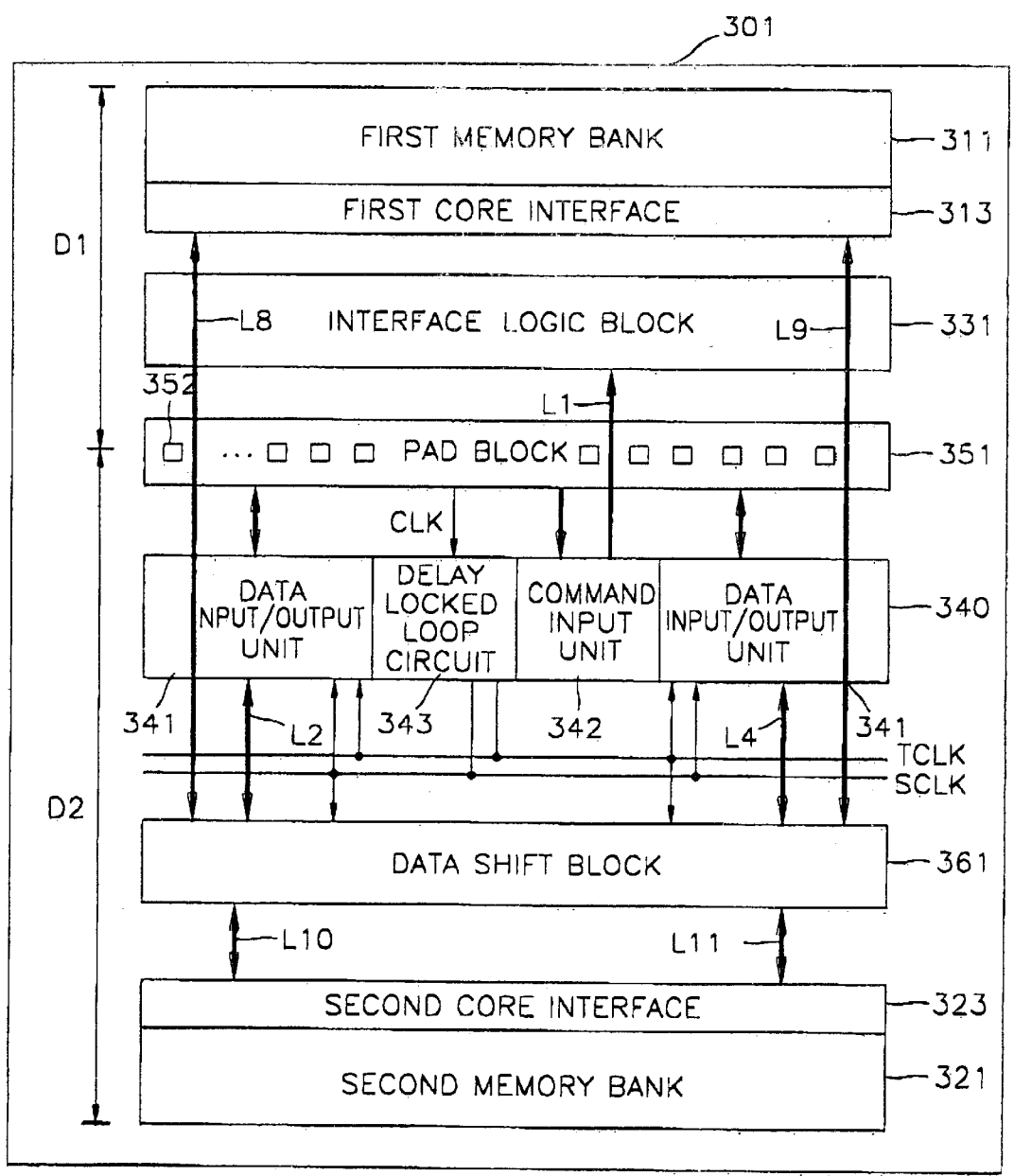
FIG. 3 is a block diagram showing arrangements of functional blocks in an integrated circuit memory device such as a Rambus DRAM according to embodiments of the present invention.

Referring to FIG. 3, integrated circuit memory devices such as Rambus Dynamic Random Access Memory (DRAM) devices according to embodiments of the present invention comprise a first memory core block including a fist memory bank 311 and a first core interface 313, an interface logic block 331, a pad block 351, an input/output and internal clock signal generation block 340 including a data input/output unit 341, a command input unit 342 and a delay locked loop circuit 343, a data shift block 361 and a second memory core block including a second memory bank 321 and a second core interface 323, all in an intergrated circuit substrate 301 such as a semiconductor substrate. Particularly, in the memory device, the interface logic block 331 is located between the first core interface 313 of the first memory core block and the pad block 351. The input/output and internal clock signal generation block 340 and the data shift block 361 are located between the pad block 351 and the second core interface 323 of the second memory core block. The input/output and internal clock signal generation block 340 is located adjacent to the pad block 351, and the data shift block 361 is located adjacent to the second core interface 323 of the second memory core block.

In some embodiments of the invention, the first memory bank 311, the first core interface 313, the interface logic block 331, the pad block 351, the input/output and internal clock signal generation block 340, the data shift block 361, the second core interface 323 and the second memory bank 321 are sequentially arranged in one axial direction (the longer direction) of the substrate 301. In the input/output and internal clock signal generation block 340, the delay locked loop circuit 343 is located between the data input/output unit 341 and the command input unit 342.

In other embodiments, integrated circuit memory devices according to the present invention are designed such that the distance D1 between the first memory core block and the pad block 351 is equal to the distance between the pad block 351 and the second memory core block. In other words, the memory device shown in FIG. 3 may be designed such that the pad block 351 is in the middle of the substrate 301 in one axial direction, namely, the vertical (long) direction of the substrate 301.

The functions of the functional blocks and potential effects of arrangements as shown in FIG. 3, according to embodiments of the invention, will now be described. The first memory bank 311 of the first memory core block includes a memory cell array including memory cells. Under control of the interface logic block 331, the first core interface 313 of the first memory core block writes data, which is transmitted via wires L8 and L9 from the data shift block 361, to the first memory bank 311 during a write operation, and reads data stored in the first memory bank 311 to transmit the data to the data shift block 361 via the wires L8 and L9 during a read operation.

The second memory bank 321 of the second memory core block also includes a memory cell array including memory cells. Under control of the interface logic block 331, the second core interface 323 of the second memory core block writes data, which is transmitted via wires L10 and L11 from the data shift block 361, to the second memory bank 321 during the write operation and reads data stored in the second memory bank 321 to transmit the data to the data shift block 361 via the wires L10 and L11 during the read operation.

The first core interface 313 and the second core interface 323 are selectively operated by a bank selection signal (not shown). The first core interface 313 includes control circuits, such as sense amplifiers input/output lines, an address decoder and a pre-charge circuit, for controlling the first memory bank 311. Similarly, the second core interface 323 includes control circuits for controlling the second memory bank 321.

The pad block 351 includes a plurality of data input/output pads, a plurality of command input pads, a plurality of clock signal input pads, a plurality of power supply voltage pads, a plurality of ground voltage pads and/or other pads. As shown, these pads 352 are arranged to form a line or row.

The command input unit 342 of the input/output and internal clock signal generation block 340 includes a plurality of command input buffers. The command input unit 342 receives and buffers commands input from external of the device via the command input pads of the pad block 351 and outputs the commands to the interface logic block 331 via a wire L1.

The delay locked loop circuit 343 of the input/output and internal clock signal generation block 340 receives an external clock signal CLK input from external of the device via the clock signal input pad of the pad block 351 and generates a plurality of internal clock signals. An input control clock signal SCLK and an output control clock signal TCLK from the internal clock signals are provided to the data shift block 361 and the data input/output unit 341 via clock lines.

The data input/output unit 341 of the input/output and internal clock signal generation block 340 includes a plurality of data input/output buffers. The data input/output unit 341 sends and receives data to and from external of the device via the data input/output pads of the pad block 351. During the write operation, the data input from external of the device that is received via the input/output pads of the pad block 351, is buttered by the data input/output unit 341 and then sent to the data shift block 361 via wires L2 and L4, such as data lines. During the read operation, the data input/output unit 341 receives and buffers output data transmitted from the data shift block 361 via the wires L2 and L4. The buffered output data from the data input/output unit 341 is output to external of the device via the data input/output pads of the pad block 351.

The interface logic block 331 receives and analyzes the command input from the command input unit 342 via the wire L1 to control the first and second memory core blocks, the input/output and internal clock signal generation block 340 and the data shift block 361 control lines that are not shown.

The data shift block 361 operates in synchronization with the input control clock signal SCLK and the output control clock signal TCLK. The data shift block 361 sends and receives data to and from the data input/output unit 341 via the wires L2 and L4 (data lines), in synchronization with the input control clock signal SCLK and the output control clock signal TCLK. The data shift block 361 also sends and receives data to and from the first core interface 313 of the first memory core block via the wires L8 and L9 and the second core interface 323 of the second memory core block via the wires L10 and L11 in synchronization with the input control clock signal SCLK and the output control clock signal TCLK.

Specifically, embodiments of the data shift block 361 have a pipeline structure. In other words, during the write operation, the data shift block 361 receives data serially transmitted from the data input/output unit 341 via the wires L2 and L4 and sends the data in parallel to the first core interface 313 via the wires L8 and L9 or to the second core interface 323 via the wires L10 and L11. During the read operation, the data shift block 361 receives data transmitted in parallel from the first core interface 313 via the wires L8 and L9 or from the second core interface 323 via the wires L10 and L11 and sends the data to the data input/output unit 341 serially.

Figure 2:
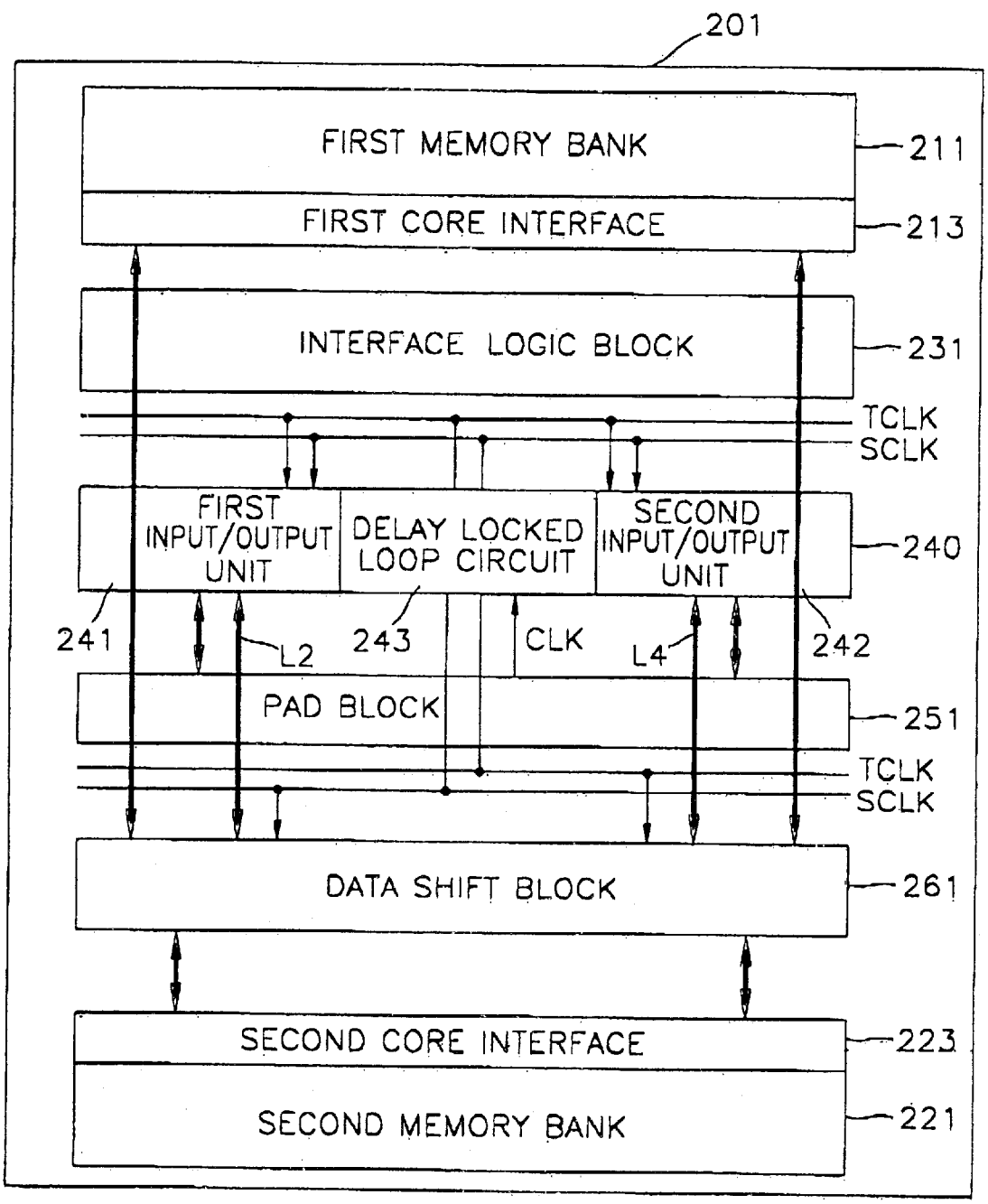
FIG. 2 is a block diagram showing an arrangement of functional blocks in another Rambus DRAM.

In contrast to Rambus DRAMs shown in FIG. 2, in integrated circuit memory devices such as Rambus DRAMs according to embodiments of the present invention, as described above, the pad block 351 need not be arranged between the input/output and internal clock signal generation block 340 and the data shift block 361. Accordingly, the lengths of the wires L2 and L4, and the lengths of the data lines for transmitting data between the data input/output unit 341 and the data shift block 361 can be reduced. Therefore, the loads on the wires L2 and L4 can be small compared with the Rambus DRAM shown in FIG. 2, thereby allowing data transmission speed to be maintained and/or power consumption to be reduced. Moreover, compared to the Rambus DRAM shown in FIG. 2, the wires L2 and L4 (data lines), need not be wired between the pads 352 so that the area of the substrate need not increase in the horizontal (shorter) direction of the substrate 301 as shown in FIG. 3

In addition, embodiments of the present invention may be designed such that the distance D1 between the first memory core block and the pad block 351 can be approximately equal to the distance D2 between the pad block 351 and the second memory core block. That is, the pad block 351 call be designed to be located in the middle of the substrate 301 in one axial direction, namely, a vertical (longer) direction of the substrate, so that memory devices can be accurately packaged on a module board.

In the drawings and specification, there have been disclosed typical preferred embodiments of the invention and, although specific terms are employed, they are used in a generic and descriptive sense only and not for purposes of limitations the scope of the invention being set forth in the following claims.

What is claimed is:

1. An integrated circuit memory device comprising:
    an integrated circuit substrate;
    first and second memory core blocks in the integrated circuit substrate, each including a memory cell array and control circuits that control the memory cell array;
    a pad block in the integrated circuit substrate including a plurality of pads; an input/output and internal clock signal generation block in the integrated circuit substrate, including a data input/output unit that sends and receives data to and from external of the memory device via the pad block, a command input unit that receives a command input from external of the memory device via the pad block and a delay locked loop circuit that receives an external clock signal from external of the memory device via the pad block and generates internal clock signals;
    a data shift block in the integrated circuit substrate that sends and receives data to and from the data input/output unit and sends and receives data to and from the first and second memory core blocks in synchronization with the internal clock signals; and
    an interface logic block in the integrated circuit substrate that receives and analyzes the command output from the command input unit to control the first and second memory core blocks the input/output and internal clock signal generation block and the data shift block;
    wherein the interface logic block is located in the integrated circuit substrate between the first memory core block and the pad block, and the input/output and internal clock signal generation block and the data shift block are located in the integrated circuit substrate between the pad block and the second memory core block.

2. The integrated circuit memory device of claim 1, wherein the input/output and internal clock signal generation block is located in the integrated circuit substrate adjacent to the pad block and the data shift block is located in the integrated circuit substrate adjacent to the second memory core block.

3. The integrated circuit memory device of claim 1, wherein a distance between the first memory core block and the pad block is equal to a distance between the pad block and the second memory core block.

4. The integrated circuit memory device of claim 1, wherein the delay locked loop circuit is located in the integrated circuit substrate between the data input/output unit and the command input unit.

5. The integrated circuit memory device of claim 1, wherein the pads are arranged to form a row.

6. The integrated circuit memory device of claim 1, wherein the data shift block serially receives the data transmitted from the data input/output unit and sends the data to one of the first and second memory core blocks in parallel.

7. The integrated circuit memory device of claim 1, wherein the data shift block receives the data transmitted from one of the first and second memory core blocks in parallel and serially sends the data to the data input/output unit.

8. An integrated circuit memory device comprising:
    an integrated circuit substrate;
    first and second memory core blocks in the integrated circuit substrate each including a memory cell array and control circuits that control the memory cell array;
    a pad block in the integrated circuit substrate including a plurality of pads;
    an input/output and internal clock signal generation block in the integrated circuit substrate including a data input/output unit that sends and receives data to and from external of the memory device via the pad block, a command input unit that receives a command input from external of the memory device via the pad block and a delay locked loop circuit that receives an external clock signal from external of the memory device via the pad block and generates internal clock signals;

a data shift block in the integrated circuit substrate that sends and receives data to and from the data input/output unit and sends and receives data to and from the first and second memory core blocks in synchronization with the internal clock signals; and an interface logic block in the integrated circuit substrate that receives and analyzes the command output from the command input unit to control the first and second memory core blocks, the input/output and internal clock signal generation block and the data shift block;

wherein the pad block is located in the integrated circuit substrate between the first memory core block and the second memory core block and the data shift block is located in the integrated circuit substrate between the first memory core block and the pad block or between the second memory core block and the pad block and adjacent to the input/output and internal clock signal generation block.

9. The integrated circuit memory device of claim 8, wherein the input/output and internal clock signal generation block is located in the integrated circuit substrate adjacent to the pad block and the data shift block is located in the integrated circuit substrate adjacent to the first or second memory core block.

10. The integrated circuit memory device of claim 8, wherein a distance between the first memory core block and the pad block is equal to a distance between the pad block and the second memory core block.

11. The integrated circuit memory device of claim 8, wherein the delay locked loop circuit is located in the integrated circuit substrate between the data input/output unit and the command input unit.

12. The integrated circuit memory device of claim 8, wherein the pads are arranged to form a row.

13. She integrated circuit memory device of claim 8, wherein the data shift block serially receives the data transmitted from the data input/output unit and sends the data to one of the first and second memory core blocks in parallel.

14. The integrated circuit memory device of claim 8, wherein the data shift block receives the data transmitted from one of the first and second memory core blocks in parallel and serially sends the data to the data input/output unit.

* * * * *

UNITED STATES PATENT AND TRADEMARK OFFICE
CERTIFICATE OF CORRECTION

PATENT NO. : 6,362,995 B1
DATED : March 26, 2002
INVENTOR(S) : Moon et al.

It is certified that error appears in the above-identified patent and that said Letters Patent is hereby corrected as shown below:

Title page,
Item [57], ABSTRACT,
Line 4, after the first instance of "block", please insert -- , --.

Column 8,
Line 2, begin new paragraph begining with "an input/output and internal clock"
Line 67, after "substrate", insert -- . --.

Column 10,
Line 16, change "She" to -- The --.

Signed and Sealed this

Twentieth Day of July, 2004

JON W. DUDAS
*Acting Director of the United States Patent and Trademark Office*